United States Patent
Kang et al.

(10) Patent No.: US 9,979,362 B2
(45) Date of Patent: May 22, 2018

(54) POWER AMPLIFIER

(71) Applicants: SAMSUNG ELECTRO-MECHANICS CO., LTD., Suwon-si (KR); Korea Advanced Institute of Science and Technology, Daejeon (KR)

(72) Inventors: Seung Hoon Kang, Daejeon (KR); Gyu Suck Kim, Suwon-si (KR); Song Cheol Hong, Daejeon (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days. days.

(21) Appl. No.: 14/993,640

(22) Filed: Jan. 12, 2016

(65) Prior Publication Data

US 2016/0276982 A1 Sep. 22, 2016

(30) Foreign Application Priority Data

Mar. 18, 2015 (KR) ........................ 10-2015-0037320

(51) Int. Cl.
*H03G 3/20* (2006.01)
*H03F 3/21* (2006.01)
(Continued)

(52) U.S. Cl.
CPC ............ *H03F 3/21* (2013.01); *H03F 1/0266* (2013.01); *H03F 1/223* (2013.01); *H03F 1/3211* (2013.01);
(Continued)

(58) Field of Classification Search
CPC ...... H03F 1/0266; H03F 1/223; H03F 1/3211; H03F 1/56; H03F 3/193; H03F 3/45188;
(Continued)

(56) References Cited

U.S. PATENT DOCUMENTS

| | | | | |
|---|---|---|---|---|
| 6,784,744 B2 * | 8/2004 | Tichauer | ............... | H03G 1/0017 327/534 |
| 8,482,355 B2 * | 7/2013 | Jo | ........................... | H03F 1/223 330/311 |
| 8,624,678 B2 * | 1/2014 | Scott | ..................... | H03F 1/0272 330/285 |

FOREIGN PATENT DOCUMENTS

KR 10-2010-0004494 A 1/2010

OTHER PUBLICATIONS

Koo, Bonhoon, et al. "Integrated Bias Circuits of RF CMOS Cascode Power Amplifier for Linearity Enhancement." *Microwave Theory and Techniques, IEEE Transactions on* 60.2 (2012): 340-351. (12 pages, in English).

(Continued)

*Primary Examiner* — Khanh V Nguyen
(74) *Attorney, Agent, or Firm* — NSIP Law

(57) ABSTRACT

A power amplifier include an amplifier including at least one field effect transistor (FET) that operates in an amplifying stage configured to amplify an input signal, and a body controller configured to control a bias voltage of a body terminal of the FET based on a power of the input signal. The body controller performs controlling so that the bias voltage of the body terminal is reduced in response to the power of the input signal being increased. Accordingly, such a power amplifier exhibits improved linearity.

19 Claims, 4 Drawing Sheets

(51) Int. Cl.
  *H03F 1/56* (2006.01)
  *H03F 3/193* (2006.01)
  *H03F 1/22* (2006.01)
  *H03F 1/32* (2006.01)
  *H03F 3/45* (2006.01)
  *H03F 1/02* (2006.01)
  *H03F 1/30* (2006.01)

(52) U.S. Cl.
  CPC .............. *H03F 1/56* (2013.01); *H03F 3/193* (2013.01); *H03F 3/45188* (2013.01); *H03F 1/0222* (2013.01); *H03F 1/0261* (2013.01); *H03F 1/302* (2013.01); *H03F 2200/102* (2013.01); *H03F 2200/451* (2013.01); *H03F 2200/555* (2013.01)

(58) Field of Classification Search
  CPC ........ H03F 3/04; H03F 2200/18; H03F 1/301; H03F 2200/06; H03F 2200/09; H03F 1/22; H03F 2200/61
  USPC ........ 330/136, 277, 285, 296, 301, 302, 311
  See application file for complete search history.

(56) References Cited

OTHER PUBLICATIONS

Rashtian, Hooman, et al. "Applications of body biasing in multi-stage CMOS low-noise amplifiers." *Circuits and Systems I: Regular Papers, IEEE Transactions on* 61.6 (2014): 1638-1647. (10 pages, in English).

* cited by examiner

POWER AMPLIFIER

CROSS-REFERENCE TO RELATED APPLICATION(S)

This application claims the benefit under 35 USC 119(a) of Korean Patent Application No. 10-2015-0037320 filed on Mar. 18, 2015 in the Korean Intellectual Property Office, the entire disclosure of which is incorporated herein by reference for all purposes.

BACKGROUND

1. Field

The following description relates to a power amplifier.

2. Description of Related Art

In accordance with a rapid increase in demand for a high data communication rate in a wireless transmitting and receiving system, a multi-carrier scheme or a complicated digital modulation scheme has been adopted. Thus, a power amplifier included in a transmitting and receiving module performing wideband code division multiple access (WCDMA) or long term evolution (LTE) communications has been required to have high linearity to be suitable for these approaches.

For example, in a case in which modulation schemes such as quadrature amplitude modulation (QAM) that is in a higher modulation scheme than a binary phase shift keying (BPSK) modulation scheme are used, linearity of the power amplifier may be further deteriorated.

However, because there is generally a trade-off between the linearity of the power amplifier and the power efficiency of the power amplifier, a power amplifier having a high linearity may have a negative influence on the power efficiency. For example, in order to improve the linearity of the power amplifier, a bias voltage of a gate terminal of a field effect transistor (FET) included in the power amplifier may be adjusted, which may have a large influence on the power efficiency of the power amplifier. In addition, controlling the linearity by managing the bias voltage of the gate terminal is sensitive to a change in process-voltage-temperature (PVT).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present examples provides a power amplifier.

In one general aspect, a power amplifier includes an amplifier includes a field effect transistor (FET) that operates in an amplifying stage, configured to amplify an input signal, and a body controller connected to the amplifier, configured to control a bias voltage of a body terminal of the FET based on a power of the input signal, wherein the body controlling performs controlling such that the bias voltage of the body terminal is reduced in response to the power of the input signal input to the amplifier being increased.

The amplifier may include a first field effect transistor configured to amplify an input signal input into a gate terminal of the first field effect transistor and to output the amplified signal through a drain terminal of the first field effect transistor, and a second field effect transistor connected to the first field effect transistor in a cascode structure configured to receive the signal amplified by the first field effect transistor through a source terminal of the second field effect transistor and to output the received signal through a drain terminal of the second field effect transistor.

The body controller may control a bias voltage of a body terminal of the second field effect transistor, and a body terminal of the first field effect transistor may be connected to a source terminal of the first field effect transistor.

The body controller may be connected to the gate terminal of the first field effect transistor and senses the power of the input signal, and may be connected to a body terminal of the second field effect transistor and may control a voltage of the body terminal.

The body controller may include a third field effect transistor that receives the input signal through a gate terminal of the third field effect transistor, a fourth field effect transistor that has a drain terminal connected to a drain terminal of the third field effect transistor, and a capacitor connected to the drain terminal and a source terminal of the fourth field effect transistor.

The amplifier and the body controller may be formed using a complementary metal oxide semiconductor (CMOS) process.

The power amplifier may further include a first balun connected to the amplifier configured to convert the input signal from a single signal into differential signals, and a second balun connected to the amplifier configured to convert the differential signals amplified by the amplifier into a single signal.

The power amplifier may further include a first matching network connected to the amplifier that causes an input impedance of the amplifier to become a preset value, and a second matching network connected to the amplifier that may cause an output impedance of the amplifier to become a preset value.

In another general aspect, a power amplifier includes an amplifier comprising a FET that operates in an amplifying stage configured to amplify an input signal, and a voltage provider connected to the amplifier configured to provide a first voltage to a body terminal of the FET in response to the voltage provider being operated in a first mode and configured to provide a second voltage lower than the first voltage to the body terminal of the FET in response to the voltage provider being operated in a second mode, wherein power of an input signal input to the amplifier in response to the voltage provider being operated in the first mode is lower than power of an input signal input to the amplifier in response to the voltage provider being operated in the second mode.

The amplifier may include a first field effect transistor configured to amplify an input signal input into a gate terminal of the first field effect transistor and to output the amplified signal through a drain terminal of the first field effect transistor, and a second field effect transistor connected to the first field effect transistor in a cascode structure configured to receive the signal amplified by the first field effect transistor through a source terminal of the second field effect transistor and to output the received signal through a drain terminal of the second field effect transistor, wherein the voltage provider provides the first voltage or the second voltage to a body terminal of the second field effect transistor, and a body terminal of the first field effect transistor may be connected to a source terminal of the first field effect transistor.

The voltage provider may sense the power of the input signal input to the amplifier, and an operation mode of the voltage provider may be determined based on a power of the sensed power.

In another general aspect, a power amplifier includes a body controller connected to an amplifier configured to amplify an input signal based on a power of an input signal, configured to control a bias voltage of a body terminal of the amplifier based on a power of the input signal, wherein the body controller performs controlling such that the bias voltage of the body terminal is reduced in response to the power of the input signal input to the amplifier being increased.

The amplifier may include a first field effect transistor configured to amplify an input signal input into a gate terminal of the first field effect transistor and to output the amplified signal through a drain terminal of the first field effect transistor, and a second field effect transistor connected to the first field effect transistor in a cascode structure configured to receive the signal amplified by the first field effect transistor through a source terminal of the second field effect transistor and to output the received signal through a drain terminal of the second field effect transistor.

The body controller may control a bias voltage of a body terminal of the second field effect transistor, and a body terminal of the first field effect transistor may be connected to a source terminal of the first field effect transistor.

The body controller may be connected to the gate terminal of the first field effect transistor and may sense the power of the input signal, and may be connected to a body terminal of the second field effect transistor and may control a voltage of the body terminal.

The body controller may include a third field effect transistor that receives the input signal through a gate terminal of the third field effect transistor, a fourth field effect transistor that has a drain terminal connected to a drain terminal of the third field effect transistor, and a capacitor connected to the drain terminal and a source terminal of the fourth field effect transistor.

The amplifier and the body controller may be formed using a complementary metal oxide semiconductor (CMOS) process.

The power amplifier may further include a first balun connected to the amplifier configured to convert the input signal from a single signal into differential signals, and a second balun connected to the amplifier configured to convert the differential signals amplified by the amplifier into a single signal.

The power amplifier may further include a first matching network connected to the amplifier that causes an input impedance of the amplifier to become a preset value, and a second matching network connected to the amplifier that causes an output impedance of the amplifier to become a preset value.

According to another example, a power amplifier may include an amplifying unit including at least one FET operated in an amplifying stage to amplify an input signal, and a capacitance controlling unit controlling a junction capacitance of a body terminal of the FET based on a power of the input signal. The capacitance controlling unit may perform controlling such that the junction capacitance of the body terminal is reduced as the power of the input signal is increased.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, examples are described in further detail with reference to the accompanying drawings.

Figure 1:
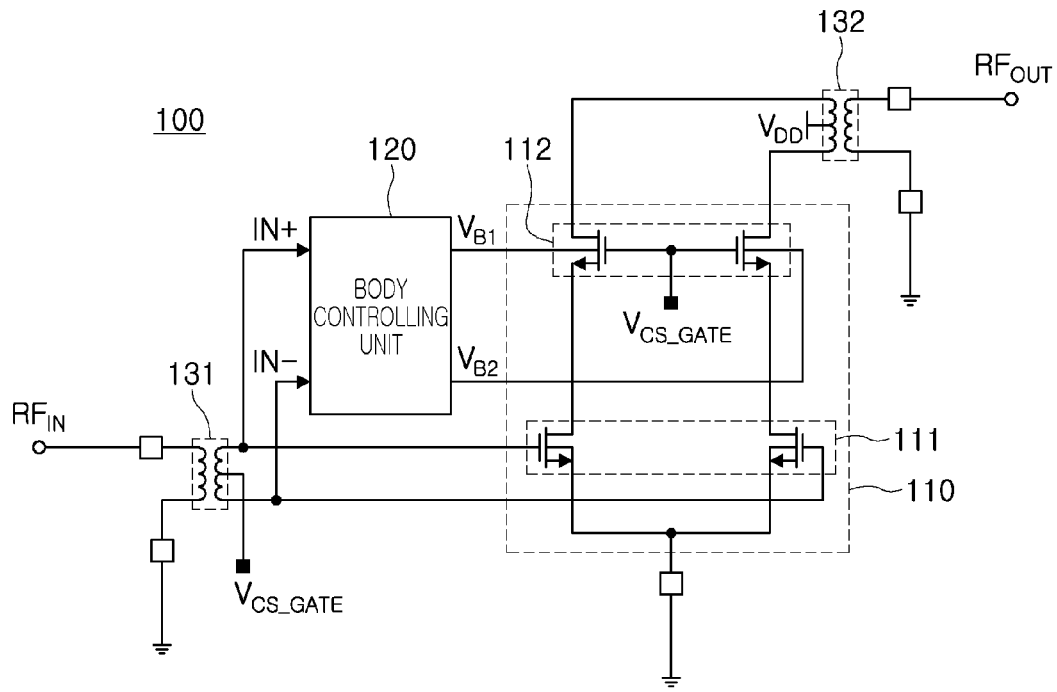
FIG. 1 is a view illustrating a power amplifier including a body controlling unit according to an example.

FIG. 1 is a view illustrating a power amplifier including a body controlling unit according to an example.

Referring to the example of FIG. 1, a power amplifier 100 according to an example includes an amplifying unit 110 and a body controlling unit 120.

For example, the amplifying unit 110 includes a field effect transistor (FET) that receives an input signal through its source terminal or its gate terminal in order to amplify the input signal. For example, the amplifying unit 110 is designed based on a linear amplifying scheme that has linearity higher than that of a non-linear amplifying scheme and power efficiency that is lower than that of the non-linear amplifying scheme.

In such an example, the amplifying unit 110 includes a first field effect transistor 111 that amplifies an input signal input through its gate terminal and outputs the amplified signal through its drain terminal and a second field effect transistor 112 connected to the first field effect transistor 111 in a cascode structure, so as to receive the signal amplified by the first field effect transistor 111 through its source terminal and output the received signal through its drain terminal. Here, in an example, the first field effect transistor 111 is operated in a common source (CS) amplifying stage, and the second field effect transistor 112 is operated in a common gate (CG) amplifying stage.

Therefore, in a case in which breakdown voltages of the first and second field effect transistors 111 and 112 are low, the amplifying unit 110 stably amplifies the input signal.

In this example, the body controlling unit 120 is connected to the amplifying unit 110 so as to control a bias voltage of a body terminal of the FET included in the amplifying unit 110, based on a power of the input signal. In further detail, in this example, the body controlling unit 120 performs controlling so that the bias voltage of the body terminal of the FET is reduced as the power of the input signal input to the amplifying unit 110 is increased. Therefore, linearity of the power amplifier 100 is improved in a case in which the power amplifier 100 amplifies a small signal of which power is low as compared with linearity in a case in which the power amplifier 100 amplifies a large signal of which power is high.

For example, the body controlling unit 120 controls a bias voltage of a body terminal of the second field effect transistor 112. Here, in this example, the body terminal and a source terminal of the first field effect transistor 111 are connected to each other.

For example, the body controlling unit 120 is connected to the gate terminal of the first field effect transistor in order to sense the power of the input signal, and is connected to the body terminal of the second field effect transistor 112 to control a voltage of the body terminal.

Meanwhile, for example, the amplifying unit 110 and the body controlling unit 120 are implemented using a complementary metal oxide semiconductor (CMOS) process. In an example, the entire power amplifier 100 is implemented using the CMOS process.

Most general transmitting and receiving modules are implemented by the CMOS process and are integrated into a single chip. However, in some examples, the power amplifier is implemented using a compound semiconductor process such as a Indium Gallium Phosphide (InGaP)/Gallium Arsenide (GaAs) Heterojunction Bipolar Transistor HBT or Gallium Nitride (GaN). The heterojunction bipolar transistor (HBT) is a type of bipolar junction transistor (BJT) which uses differing semiconductor materials for the emitter and base regions, creating a heterojunction. The HBT improves on the BJT in that it can handle signals of very high frequencies, up to several hundred GHz.

In an example in which a chip implemented by the CMOS process and a chip implemented by the compound semiconductor process as discussed above are integrated into one package in a multi-chip structure, a size of a chip is potentially increased, and thus a cost of the chip is potentially increased, and it is potentially difficult to couple the chip to a CMOS bias circuit for improving linearity of the power amplifier.

Therefore, in an example, the amplifying unit 110 and the body controlling unit 120 are both implemented by the CMOS process, and as a result the entire transmitting and receiving module are integrated in one package in a single chip structure. Therefore, accordingly, a size of a chip is decreased, and thus a cost of the chip is also decreased.

For example, the power amplifier implemented by the CMOS process has a breakdown voltage lower than that of the power amplifier implemented by the compound semiconductor process. Therefore, in such an example, the amplifying unit 110 has a cascode structure in which two transistors 111 and 112 are stacked.

Meanwhile, in such an example, the power amplifier 100 further includes a first balanced to unbalanced transformer, hereinafter, referred to as a balun, 131 connected to the amplifying unit 110 so as to convert an input signal from a single signal into differential signals and a second balun 132 connected to the amplifying unit 110 so as to convert the differential signals amplified by the amplifying unit 110 into a single signal. For example, the power amplifier 100 amplifies the differential signals.

Figure 2:
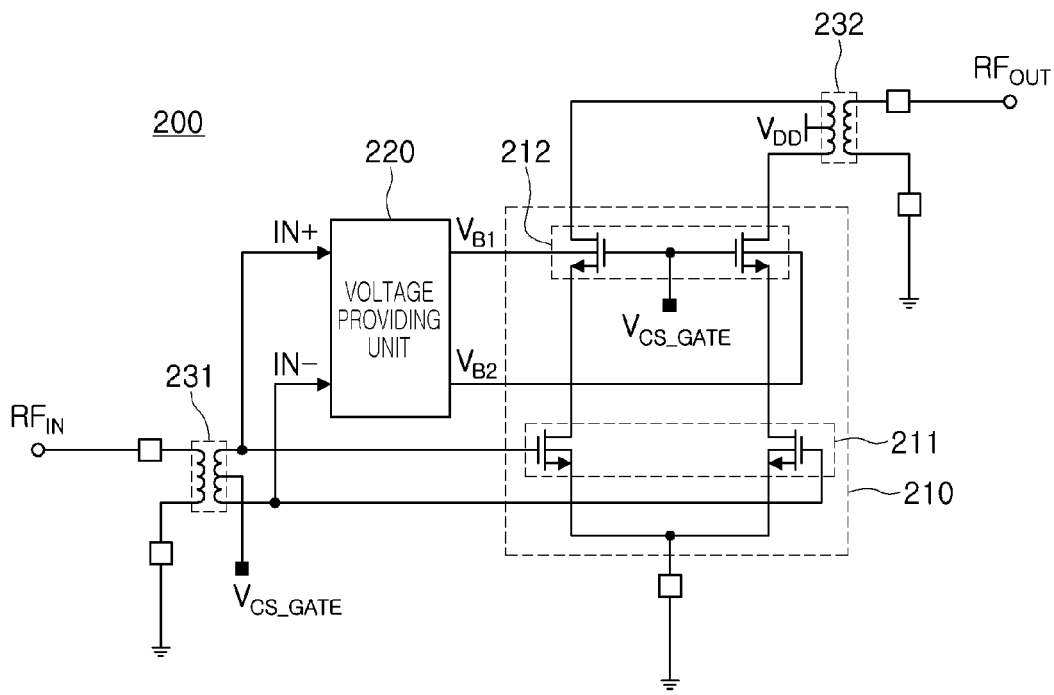
FIG. 2 is a view illustrating a power amplifier including a voltage providing unit according to another example.

FIG. 2 is a view illustrating a power amplifier including a voltage providing unit according to another example.

Referring to the example of FIG. 2, a power amplifier 200 according to another example includes an amplifying unit 210 and a voltage providing unit 220.

For example, the amplifying unit 210 includes a FET that receives an input signal through its source terminal or its gate terminal in order to amplify the input signal.

In this example, the amplifying unit 210 includes a first field effect transistor 211 that amplifies an input signal input through its gate terminal and outputs the amplified signal through its drain terminal. The amplifying unit 210 also includes a second field effect transistor 212 connected to the first field effect transistor 211 in a cascode structure in order to receive the signal amplified by the first field effect transistor 211 through its source terminal and to output the received signal through its drain terminal.

Here, the voltage providing unit 220 is connected to the amplifying unit 210 so as to provide a first voltage to the body terminal of the FET when the voltage providing unit 220 is operated in a first mode and provide a second voltage that is lower than the first voltage to the body terminal of the FET when the voltage providing unit 220 is operated in a second mode. In this example, the first mode is an amplification mode of a low power signal, and the second mode is an amplification mode of a high power signal.

In further detail, power of an input signal input to the amplifying unit 210 when the voltage providing unit 220 is operated in the first mode is lower than that of an input signal input to the amplifying unit 210 when the voltage providing unit 220 is operated in the second mode. Therefore, linearity of the power amplifier 200 is improved in the first mode in which the power amplifier 200 amplifies a small signal of which a power is low as compared with in the second mode in which the power amplifier 200 amplifies a large signal of which a power is high.

For example, the voltage providing unit 220 provides the first voltage or the second voltage to a body terminal of the second field effect transistor 212. Here, in this example, a body terminal and a source terminal of the first field effect transistor 211 are connected to each other.

For example, the voltage providing unit 220 senses the power of the input signal that is input into the amplifying unit 210, and an operation mode of the voltage providing unit 220 is potentially determined based on a power of the sensed power. However, the power of the input signal is not limited to being sensed in only the voltage providing unit 220, and is also potentially sensed outside the power amplifier 200 depending on a design. For example, a detailed operation of the voltage providing unit 220 is potentially similar to a detailed operation of a body controlling unit that is described below, further, with reference to FIG. 6.

Meanwhile, in an example, a difference between the first and second voltages is 0.3V or more and is equal to or less than a level of a power supply $V_{DD}$ voltage. When the difference between the first and second voltages is large, the voltage providing unit 220 is then as a result insensitive to a change in process-voltage-temperature (PVT), and thus the voltage providing unit 230 is able to be stably operated in the first mode or the second mode. Therefore, the voltage providing unit 220 is insensitive to the change in the PVT to stably improve linearity.

Figure 3:
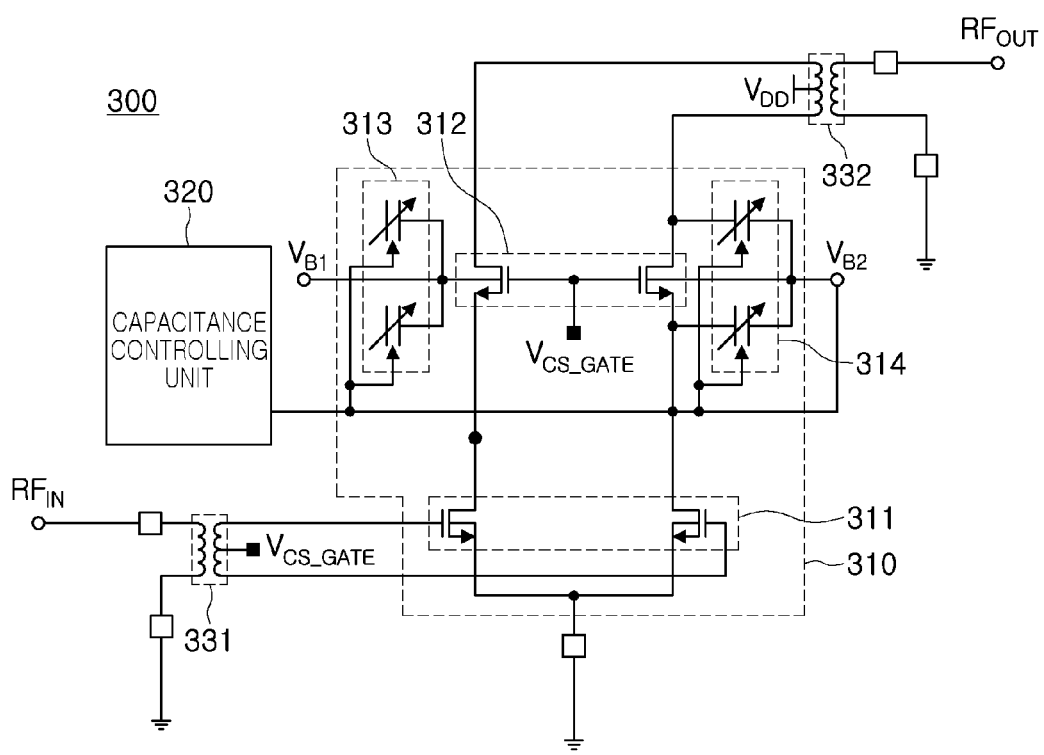
FIG. 3 is a view illustrating a power amplifier including a capacitance controlling unit according to another example.

FIG. 3 is a view illustrating a power amplifier including a capacitance controlling unit according to another example.

Referring to the example of FIG. 3, a power amplifier 300 according to another example includes an amplifying unit 310 and a capacitance controlling unit 320.

In such an example, the amplifying unit 310 includes an FET that receives an input signal through its source terminal or its gate terminal in order to amplify the input signal.

For example, the amplifying unit 310 includes a first field effect transistor 311 that amplifies an input signal input through its gate terminal and outputs the amplified signal through its drain terminal The amplifying unit 310 also includes a second field effect transistor 312 connected to the first field effect transistor 311 in a cascode structure in order to receive the signal amplified by the first field effect transistor 311 through its source terminal and to output the received signal through its drain terminal.

The capacitance controlling unit 320 is connected to the amplifying unit 310 in order to control a junction capacitance of a body terminal of the FET based on a power of the input signal.

More specifically, the capacitance controlling unit 320 performs a controlling operation so that the junction capacitance of the body terminal of the FET is reduced as the power of the input signal input to the amplifying unit 310 is increased. Therefore, by operation in this manner, linearity of the power amplifier 300 is improved in a case in which the power amplifier 100 amplifies a small signal of which power is low as compared to a case in which the power amplifier 100 amplifies a large signal of which power is high. A more detailed explanation of the operation of the capacitance controlling unit 320 is similar to a detailed explanation of the operation of a body controlling unit that is to be described below with reference to FIG. 6.

For example, the capacitance controlling unit 320 controls a junction capacitance of a body terminal of the second field effect transistor 312. In such an example, a body terminal and a source terminal of the first field effect transistor 311 are connected to each other.

Meanwhile, the power amplifier 300 may further include varactors 313 and 314 connected between the source terminal or the drain terminal and the body terminal of the second field effect transistor 312. Here, a varactor is a type of diode designed to exploit the voltage-dependent capacitance of a reversed-biased p-n junction. These varactors are used as voltage-controlled capacitors. Therefore, the capacitance controlling unit 320 controls bias voltages of the varactors 313 and 314 in order to control the junction capacitance of the body terminal of the second field effect transistor 312.

Figure 4:
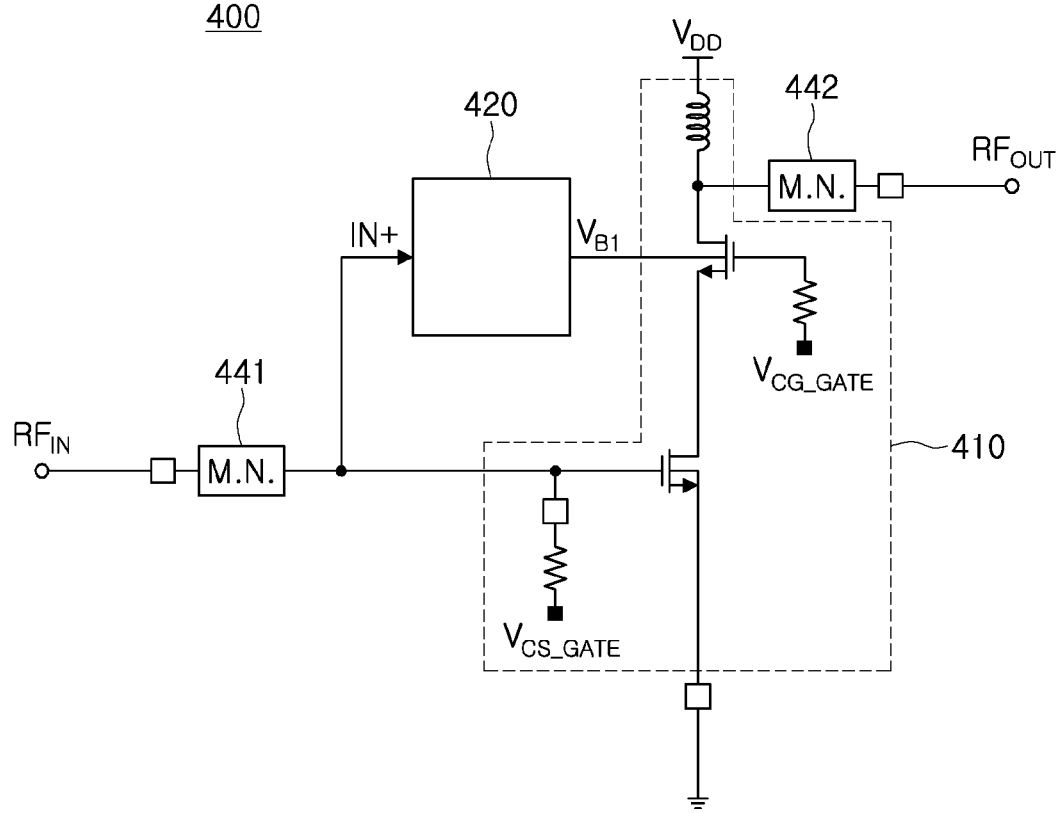
FIG. 4 is a view illustrating a power amplifier amplifying a single signal according to another example.

FIG. 4 is a view illustrating a power amplifier amplifying a single signal according to another example.

Referring to the example of FIG. 4, a power amplifier 400 according to another example includes an amplifying unit 410 and a body controlling unit 420 to amplify a single signal.

For example, the power amplifier 400 further includes a first matching network 441 connected to the amplifying unit 410 so that an input impedance of the amplifying unit 410 becomes a preset value and a second matching network 442 connected to the amplifying unit 410 so that an output impedance of the amplifying unit 410 becomes a preset value.

Figure 6:
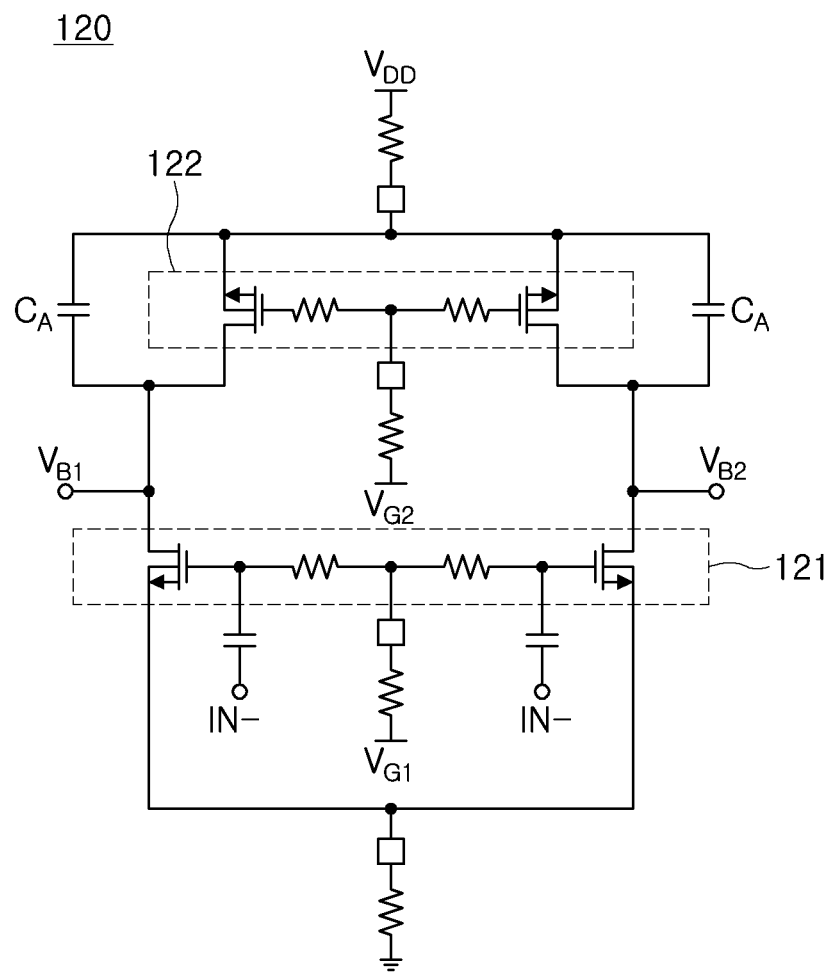
FIG. 6 is a view illustrating the body controlling unit illustrated in the example of FIG. 1.

Meanwhile, the body controlling unit is simply implemented by using only a half circuit of a body controlling unit 120 as illustrated in FIG. 6.

Figure 5:
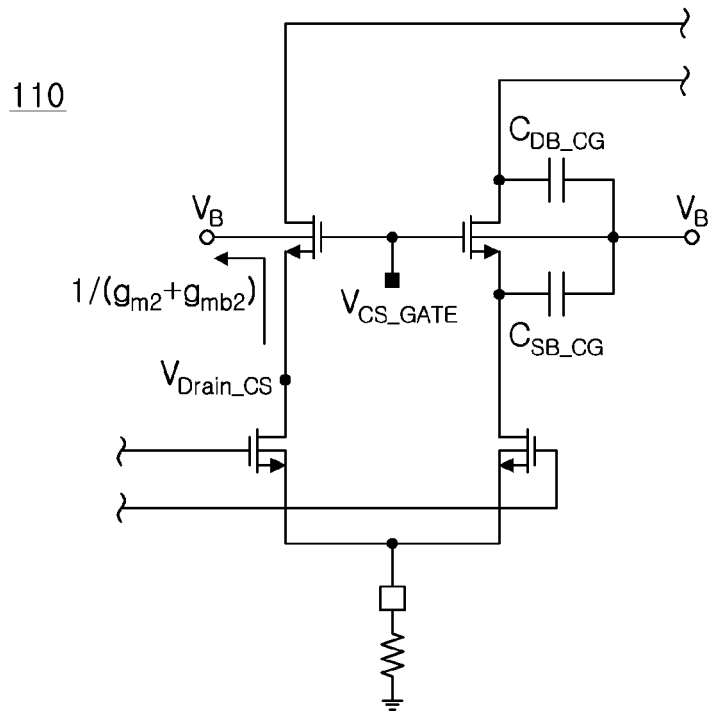
FIG. 5 is a view illustrating an amplifying unit illustrated in the example of FIG. 1.

FIG. 5 is a view illustrating an amplifying unit illustrated in the example of FIG. 1.

Referring to the example of FIG. 5, characteristics of the FET included in the amplifying unit are represented by a body transconductance $g_{mb2}$ and junction capacitances $C_{SB\_CG}$ and $C_{DB\_CG}$. Subsequently, the reasons why a gain is increased and a phase is decreased as a voltage $V_B$ of the body terminal of the FET is increased are described further.

First, the reason why the gain is increased is related to the body transconductance.

For example, in a case in which a voltage of a body terminal of a CG amplifying stage rises, a source voltage of the CG amplifying stage also rises, which corresponds to a rise in a drain voltage of a CS amplifying stage. When the drain voltage of the CS amplifying stage is increased, a larger bias current flows into the CS amplifying stage. As a result, a gain of the CS amplifying stage is increased, thereby resulting in an increase in a gain of the power amplifier.

In this example, a gain of the CG amplifying stage is in proportion to a term gm of the CG amplifying stage. Also, because a body and a source are not connected to each other, a gain $A_{v2}$ of the CG amplifying stage in which a body-effect is considered is represented by Equation 1. Meanwhile, a body transconductance $g_{mb2}$ of the CG amplifying stage generated from the body-effect is represented by a function of $V_{SB}$, which is a voltage between source and body nodes, of the CG amplifying stage as in Equation 2. When the voltage $V_B$ is increased, the voltage $V_{SB}$ is correspondingly decreased and $g_{mb2}$ is correspondingly increased. For instance, the increase in the voltage $V_B$ allows the gain of the CG amplifying stage to be increased, thereby resulting in the increase in the gain of the power amplifier.

$$A_{v2} \propto (g_{m2} + g_{mb2}) \quad \text{Equation 1}$$

$$g_{mb2} = g_m \cdot \frac{\gamma_B}{2(|2\Phi_F| + V_{SB})^{1/2}} \quad \text{Equation 2}$$

Second, the reason why the phase is decreased is related to the junction capacitance.

Generally, a change in the phase is related to a change in a capacitance. For instance, when the capacitance increases, the phase correspondingly decreases, and when the capacitance decreases, the phase correspondingly increases. Thus, when the voltage $V_B$ of the CG amplifying stage is increased, the change in the phase is inferred by observing the change in the capacitance of the power amplifier.

For example, a junction capacitance of a transistor is represented by Equation 3. When the voltage $V_B$ is increased, a drain-body junction capacitance $C_{DB\_CG}$ and a source-body junction capacitance $C_{SB\_CG}$ of the CG amplifying stage are increased. These effects cause a phenomenon that a phase of the power amplifier decreases.

$$C_{DB} = \frac{C_{db0}}{\left(1 + \frac{V_{DB}}{\Psi_0}\right)^{1/2}}, \quad \text{Equation 3}$$

$$C_{SB} = \frac{C_{sb0}}{\left(1 + \frac{V_{SB}}{\Psi_0}\right)^{1/2}}$$

FIG. 6 is a view illustrating the body controlling unit illustrated in the example of FIG. 1.

Referring to the example of FIG. 6, the body controlling unit 120 includes a third field effect transistor 121, a fourth field effect transistor 122, and a capacitor $C_A$.

In such an example, the third field effect transistor 121 receives the input signal at its gate terminal.

Also, the fourth field effect transistor 122 has a drain terminal connected to a drain terminal of the third field effect transistor 121.

For example, the capacitor $C_A$ is connected to the drain terminal and a source terminal of the fourth field effect transistor 122.

Hereinafter, a detailed operation of the body controlling unit 120 is described further.

The body controlling unit 120 receives input signals $V_{G1}$ and $V_{G2}$ of the power amplifier 100 in order to sense input signals $V_{G1}$ and $V_{G2}$ through the third field effect transistor 121 and to perform R-C low pass filtering on the input signals through the fourth field effect transistor 122 and the capacitor $C_A$, thereby converting the input signals $V_{G1}$ and $V_{G2}$ into direct current (DC) voltages.

Therefore, as the input voltages are increased, output voltages $V_{B1}$ and $V_{B2}$ of the body controlling unit 120 correspondingly decrease. Accordingly, the output voltages of the body controlling unit 120 are input to the body terminal of the FET included in the amplifying unit of the power amplifier.

Here, in this example, the fourth field effect transistor 122 serves as a resistor in the R-C low pass filtering process. Thus, the fourth field effect transistor 122 is operated in a triode region when the input voltage of the body controlling unit 120 is low and is operated in a saturation region while a voltage at its drain node is significantly varied, when the input voltage of the body controlling unit 120 is high. For instance, as the input voltage is increased, a drain-source equivalent resistance of the fourth field effect transistor 122 accordingly increases, and thus the output voltage of the body controlling unit 120 is significantly decreased.

In such an example, the body controlling unit 120 consumes a DC current of 0.2 mA or a similar small amount. Since such a DC current of 0.2 mA is negligible as compared to a current, which ranges from several tens to several hundreds of mA generally consumed in the power amplifier, the body controlling unit 120 generally does not substantially influence power efficiency of the power amplifier.

In addition, in such an example, a size of the body controlling unit 120 is small, and thus it also does not have a substantial influence on a size of the power amplifier.

Hereinafter, performance aspects of the power amplifier are described further.

In an example of a gate node of the FET, performance aspects, such as power gain, efficiency, and IMD3, of the power amplifier are potentially significantly changed even as a result of a change of 10 mV. The meaning that characteristics are sensitive is that performance is significantly changed even in a small change of underlying factors. Therefore, it is potentially difficult for the power amplifier to perform a stable operation, depending on an internal or external stimulus and a related change.

Generally, in a power amplifier that handles a large signal, output gain change characteristics depending on input power are called AM/AM characteristics, and output phase change characteristics depending on input power are called AM/PM characteristics. These two characteristics, namely AM/AM and AM/PM, significantly contribute to determining linearity of the power amplifier. When changes in AM/AM and AM/PM are small, it is considered that linearity of the power amplifier is desirable.

As an output voltage $V_B$ of the body controlling unit is increased, a gain accordingly increases and a phase accordingly decreases. The power amplifier according to such an example has a high output voltage $V_B$ in a small signal region and a low output voltage $V_B$ in a large signal region provided by the body controlling unit. As a result, changes in the gain and the phase from low output power to high output power are decreased as little as possible and linearity of the power amplifier is improved accordingly.

Thus, the body terminal of the FET is controlled by the body controlling unit, such that the body voltage is implemented so as to be high at low output power and be implemented so as to be low at high output power.

For instance, in the power amplifier according to an example, changes in the gain and the phase from low output power to high output power are decreased as little as possible, and accordingly the linearity of the power amplifier is improved.

In the power amplifier according to an example, AM/AM distortion from a small signal to a maximum output power point was decreased and thereby improved from 1.7 dB to 0.7 dB, for instance, and hence was improved by 1 dB, and AM/PM distortion from a small signal to a maximum output power point was decreased and thereby improved from 12 degrees to 5 degrees, for instance, and hence was improved by 7 degrees.

Thus, accordingly, linearity aspects of characteristics of AM/AM, AM/PM, and IMD3 values of the power amplifier are significantly improved in examples in operation of both of a low output power portion and a high output power portion.

Thus, In a power amplifier according to an example, general IMD3 from low output power to high output power is improved in a range spanning from at least 6 dB to at most 12 dB. In relation to a value of −35 dBc of IMD3, an alternative approach only satisfies performance up to output power of about 10 dBm, while the present examples satisfy high output power up to 27.5 dBm.

As set forth above, according to an example, the linearity of the power amplifier is improved without having a large influence on the power efficiency of the power amplifier, and the power amplifier is insensitive to the change in PVT. Thus, by using such an approach, the linearity of the power amplifier is stably improved.

In addition, according to an example, the linearity of the power amplifier is improved in a case in which the power amplifier amplifies a small signal of which power is low as compared to a case in which the power amplifier amplifies a large signal of which power is high.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The apparatuses, units, modules, devices, and other components illustrated in FIGS. 1-6 that perform the operations described herein with respect to FIGS. 1-6 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-6. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described herein with respect to FIGS. 1-6 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:
    an amplifier configured to amplify an input signal, and comprising field effect transistors (FETs) that operate in an amplifying stage; and
    a body controller connected to the amplifier, configured to control a bias voltage of a body terminal of at least one of the FETs based on a power of the input signal,
    wherein the body controller reduces an amount of the bias voltage supplied to the body terminal in response to the power of the input signal input to the amplifier being increased.

2. The power amplifier of claim 1, wherein
a first field effect transistor of the FETs is configured to amplify the input signal input into a gate terminal of the first field effect transistor and to output the amplified signal through a drain terminal of the first field effect transistor; and
a second field effect transistor of the FETs is connected to the first field effect transistor in a cascode structure configured to receive the signal amplified by the first field effect transistor through a source terminal of the second field effect transistor and to output the received signal through a drain terminal of the second field effect transistor.

3. The power amplifier of claim 2, wherein the body controller controls a bias voltage of a body terminal of the second field effect transistor, and
a body terminal of the first field effect transistor is connected to a source terminal of the first field effect transistor.

4. The power amplifier of claim 2, wherein the body controller is connected to the gate terminal of the first field effect transistor and senses the power of the input signal, and is connected to a body terminal of the second field effect transistor and controls a voltage of the body terminal.

5. The power amplifier of claim 1, wherein the amplifier and the body controller are formed using a complementary metal oxide semiconductor (CMOS) process.

6. The power amplifier of claim 1, further comprising:
a first balun connected to the amplifier configured to convert the input signal from a single signal into differential signals; and
a second balun connected to the amplifier configured to convert the differential signals amplified by the amplifier into a single signal.

7. The power amplifier of claim 1, further comprising:
a first matching network connected to the amplifier that causes an input impedance of the amplifier to become a preset value; and
a second matching network connected to the amplifier that causes an output impedance of the amplifier to become a preset value.

8. A power amplifier, comprising:
an amplifier configured to amplify an input signal, and comprising field effect transistors (FETs) that operate in an amplifying stage; and
a body controller connected to the amplifier, configured to control a bias voltage of a body terminal of at least one of the FETs based on a power of the input signal, and the body controller comprising a FET and another FET,
wherein the body controlling performs controlling such that the bias voltage of the body terminal is reduced in response to the power of the input signal input to the amplifier being increased, and
wherein the FET of the body controller is configured to receive the input signal through a gate terminal of the FET,
a drain terminal of the another FET of the body controller is connected to a drain terminal of the FET, and
a capacitor is connected to the drain terminal and a source terminal of the another FET.

9. A power amplifier comprising:
an amplifier configured to amplify an input signal, and comprising field effect transistors (FETs) configured to operate in an amplifying stage; and
a voltage provider connected to the amplifier configured to provide a first voltage to a body terminal of at least one of the FETs in response to the voltage provider being operated in a first mode and configured to provide a second voltage lower than the first voltage to the body terminal of the at least one of the FETs in response to the voltage provider being operated in a second mode,
wherein power of an input signal input to the amplifier in response to the voltage provider being operated in the first mode is lower than power of an input signal input to the amplifier in response to the voltage provider being operated in the second mode, and
wherein the second voltage is greater than zero volts.

10. The power amplifier of claim 9, wherein the amplifier comprises:
a first field effect transistor of the FETs is configured to amplify the input signal input into a gate terminal of the first field effect transistor and to output the amplified signal through a drain terminal of the first field effect transistor; and
a second field effect transistor of the FETs is connected to the first field effect transistor in a cascode structure configured to receive the signal amplified by the first field effect transistor through a source terminal of the second field effect transistor and to output the received signal through a drain terminal of the second field effect transistor,
wherein the voltage provider provides the first voltage or the second voltage to a body terminal of the second field effect transistor, and a body terminal of the first field effect transistor is connected to a source terminal of the first field effect transistor.

11. The power amplifier of claim 9, wherein the voltage provider senses the power of the input signal input to the amplifier, and an operation mode of the voltage provider is determined based on a power of the sensed power.

12. A power amplifier comprising:
a body controller connected to an amplifier, configured to control a bias voltage of a body terminal of the amplifier based on a power of an input signal,
wherein the amplifier is configured to amplify the input signal based on the power of the input signal, and
wherein the body controller reduces an amount of the bias voltage supplied to the body terminal in response to the power of the input signal input to the amplifier being increased.

13. The power amplifier of claim 12, wherein the amplifier comprises:
a first field effect transistor configured to amplify the input signal input into a gate terminal of the first field effect transistor and to output the amplified signal through a drain terminal of the first field effect transistor; and
a second field effect transistor connected to the first field effect transistor in a cascode structure configured to receive the signal amplified by the first field effect transistor through a source terminal of the second field effect transistor and to output the received signal through a drain terminal of the second field effect transistor.

14. The power amplifier of claim 13, wherein the body controller controls a bias voltage of a body terminal of the second field effect transistor, and
a body terminal of the first field effect transistor is connected to a source terminal of the first field effect transistor.

15. The power amplifier of claim 13, wherein the body controller is connected to the gate terminal of the first field effect transistor and senses the power of the input signal, and is connected to a body terminal of the second field effect transistor and controls a voltage of the body terminal.

16. The power amplifier of claim 12, wherein the amplifier and the body controller are formed using a complementary metal oxide semiconductor (CMOS) process.

17. The power amplifier of claim 12, further comprising:
a first balun connected to the amplifier configured to convert the input signal from a single signal into differential signals; and
a second balun connected to the amplifier configured to convert the differential signals amplified by the amplifier into a single signal.

18. The power amplifier of claim 12, further comprising:
a first matching network connected to the amplifier that causes an input impedance of the amplifier to become a preset value; and
a second matching network connected to the amplifier that causes an output impedance of the amplifier to become a preset value.

19. A power amplifier comprising:
a body controller connected to an amplifier, configured to control a bias voltage of a body terminal of the amplifier based on a power of an input signal,
wherein the amplifier is configured to amplify the input signal based on the power of the input signal,
wherein the body controller performs controlling such that the bias voltage of the body terminal is reduced in response to the power of the input signal input to the amplifier being increased, and
wherein the body controller comprises:
a field effect transistor (FET) is configured to receive the input signal through a gate terminal of the FET;
a drain terminal of another FET is connected to a drain terminal of the FET; and
a capacitor connected to the drain terminal and a source terminal of the another FET.

* * * * *